United States Patent [19]
Chang et al.

[11] Patent Number: 5,716,459
[45] Date of Patent: Feb. 10, 1998

[54] MONOLITHICALLY INTEGRATED SOLAR CELL MICROARRAY AND FABRICATION METHOD

[75] Inventors: Kou-I Chang, Yorba Linda; David R. Lillington, Rancho Palos Verdes, both of Calif.

[73] Assignee: Hughes Aircraft Company, Los Angeles, Calif.

[21] Appl. No.: 572,257

[22] Filed: Dec. 13, 1995

[51] Int. Cl.⁶ .................... H01L 31/06; H01L 31/18
[52] U.S. Cl. .............. 136/249 MS; 136/249 TJ; 437/2; 437/5; 437/205; 437/51
[58] Field of Search ............ 136/249 MS, 249 TJ; 437/2, 4–5, 205, 51

[56] References Cited

U.S. PATENT DOCUMENTS

| | | | |
|---|---|---|---|
| 4,156,309 | 5/1979 | Routh et al. | 437/2 |
| 4,173,496 | 11/1979 | Chiang et al. | 136/249 MS |
| 5,330,585 | 7/1994 | Chang et al. | 136/256 |
| 5,342,451 | 8/1994 | Virshup | 136/244 |

FOREIGN PATENT DOCUMENTS 59-121982  7/1984  Japan ................... 136/249 MS

*Primary Examiner*—Aaron Weisstuch
*Attorney, Agent, or Firm*—Elizabeth E. Leitereg; Terje Gudmestad; Wanda K. Denson-Low

[57] ABSTRACT

A monolithically integrated solar cell microarray includes an isolation layer or multiple isolation layers between a substrate and a solar cell layer, and a trench in the solar cell layer that exposes the isolation layer. Together the isolation layer and trench define solar cells that are spaced apart and electrically isolated on the monolithic substrate. The solar cells are scaled to provide a desired current. Base contacts and integral emitter contact/interconnects connect a number of the scaled solar cells in series to sum their voltages to supply a desired output voltage and current. The trench and integral emitter contact/interconnects are formed using photolithographic etching and liftoff processes, respectively, which are much quicker and less expensive than the conventional dicing and soldering processes.

39 Claims, 4 Drawing Sheets

MONOLITHICALLY INTEGRATED SOLAR CELL MICROARRAY AND FABRICATION METHOD

BACKGROUND OF THE INVENTION

1. Field of the Invention

The present invention generally relates to solar cell microarrays, and more specifically to a monolithically integrated solar cell microarray and a method for photolithographically isolating the individual solar cells and defining series interconnects therebetween.

2. Description of the Related Art

Microarrays which may include a hundred or more solar cells are used to provide electrical power for a variety of applications such as spacecraft. Existing microarrays are formed by growing p and n type semiconductor layers such as gallium-arsenide (GaAs) on a germanium (Ge) wafer to form an active p/n junction. The wafer is cut or "diced" into unit sized solar cells. Dicing limits the solar cells to rectangular shapes, damages the solar cells and takes approximately 30 minutes per microarray.

Irradiating the microarray with light causes each solar cell to produce a voltage potential and a current. The discrete solar cells are interconnected in series/parallel combinations to sum the individual cell voltages and currents, respectively, to supply a desired array voltage and current. The solder interconnects increase the microarray's weight, obscure the solar cells' active area thereby reducing efficiency, increase manufacturing costs and provide inferior electro-mechanical interconnects. Furthermore, the cell-to-cell spacing must be at least 100 microns.

FIG. 1 is a sectional view of a portion of a known solar cell microarray 10 bonded to a carrier 12. The microarray 10 includes a plurality of discrete single junction GaAs solar cells 14 formed on respective Ge substrates 16. Single and multi-junction GaAs cells produce potentials of approximately 1 V and 2.5 V, respectively, and supply a cell current of approximately 30 milliamperes/cm$^2$ and 16 milliamperes/cm$^2$, respectively The solar cells use electrically conductive interconnects 18 in a parallel/series circuit to produce a power supply with a desired voltage and current for a given application.

Each solar cell 14 includes an n-type GaAs base layer 20, suitably 5 microns thick, grown on substrate 16. A p-type GaAs emitter layer 22, suitably 0.5 micron thick, is grown on the base layer 20 such that their interface defines a p/n junction 24 having a band gap of approximately 1.4 eV. The substrates 16 are 200 microns Ge single crystal substrates which are suitable for Metalorganic Chemical Vapor Deposition (MOCVD) of GaAs solar cells. The Ge substrates match the thermal and lattice properties of the base and emitter layers 20 and 22, respectively. This match is important to avoid cracks in the solar cells 14.

A p-type AlGaAs window layer 26, suitably 0.05 microns thick, is grown on emitter layer 22. The window layer 26 passivates the surface 28 of the emitter layer 22 to protect the solar cell from contamination and to increase the conversion efficiency. The window layer 26 has a band gap in excess of 2 eV so that incident light is transmitted through the window to the solar cell 14.

A base contact region 30 is formed through the window and emitter layers into base layer 20. A base contact 32, suitably a AuGeNiAg alloy, is formed in contact region 30 to adhere to the n-type GaAs base layer 20. In most known microarrays, the base contact 32 is formed on the backside of the solar cell as parallel grid lines. A p-type GaAs emitter contact pad 34 or "cap" layer is formed on window layer 26 in electrical communication with the emitter layer 22. An emitter contact 36, suitably a AuZnAg alloy, is formed on the p-type contact pad 34. The base and emitter contacts are formed from different metal alloys because they must adhere to n and p-type GaAs, respectively.

Light incident on the front or active surface 37 of the microarray passes through the window layer 26 and is partially absorbed in the emitter and base layers 22 and 20, respectively. The microarray's active surface 37 and back or "shadowed" surface 38 are coated with an antireflection (AR) coating 39 that enhances light transmission, thereby increasing the array's power efficiency. The absorption of light causes liberation of charge carriers including electrons and holes in the region of the p/n junction 24, which migrate towards the top surface 28 of the emitter layer and the bottom surface 40 of the base layer, depending upon their polarity. The opposite charge carriers are collected at the base contact 32 and emitter contact 36. This generates a potential of approximately 1 V across the solar cell 14 and supplies a current of 30 milliamperes/cm$^2$.

The microarray 10 is manufactured generically, without interconnects 18, so that the manufacturer or user can configure the solar cells 14 for a particular application. The generic microarray is fabricated by first growing 200 microns thick Ge wafer. Ge wafers are limited to much smaller sizes than Si wafers, typically 10.2 cm in diameter, and are more expensive than Si. However, even though much research has been done to grow GaAs solar cells directly on Si substrates, those efforts have largely failed. The mismatch in lattice and thermal properties of Si and GaAs results in cracks in the solar cells.

The base, emitter, window, and cap layers are grown with an epitaxial process onto the wafer. The structure is then chemically etched to define all of the base contact regions 30 in parallel. Similarly the cap layer is etched to define all of the emitter contact pads 34 in parallel. The discrete base and emitter contacts 32 and 34 are formed in respective lift-off metalization steps.

The wafer is then sawed or diced to define the discrete solar cells and associated substrates. Dicing is a serial process that is limited to linear cuts of the wafer. As a result, dicing an entire wafer is a very slow and expensive process, taking up to about 30 minutes. The process can also damage the edge of the solar cells and reduce their output. Furthermore, the solar cells are limited to rectangular shapes. In known microarrays, each of the solar cells conforms to a reference size and shape. The discrete solar cells 14 and their affixed substrates 16 are bonded to the carrier 12 in physical and electrical isolation from each other.

The solar cells 14 are connected together by manually soldering interconnects 18 between contacts on adjacent solar cells along the surface of carrier 12. The connections depend upon the power supply specifications: supply voltage and supply current. These values are specified as integer multiples of the cell voltage and current so that a number of cells can be connected in parallel to provide the desired supply current and connected in series to provide the supply voltage. For example, a 5 v supply would be provided by soldering five solar cells in series. The completed structure (microarray and carrier) is then bonded to the spacecraft's solar panel.

Manual soldering is a slow, and thus expensive, serial process, taking between ½ and 2 hours per microarray, depending upon the number of contacts. The contacts between the interconnects and base and emitter contacts may be weak and break. Furthermore, the soldered interconnects 18 have a line width of approximately 125 microns which obscure a significant portion of the incident light and increases the overall weight of the microarray.

A solar cell of this general type is disclosed in U.S. Pat. No. 5,330,585 "GaAS/AlGaAs Photocell including Environmentally Sealed Ohmic Contact Grid Interface and Method of Fabricating the Cell," assigned to Hughes Aircraft Company, assignee of the present invention.

SUMMARY OF THE INVENTION

The present invention seeks to provide a light weight and efficient solar cell microarray and a cost effective method for manufacturing the microarray.

This is accomplished by forming base and emitter semiconductor layers of opposite conductivity types on a monolithic substrate. An isolation layer formed between the substrate and the base layer, together with a trench formed in the base and emitter layers that exposes the isolation layer, define solar cells that are spaced apart and electrically isolated from the monolithic substrate. The trench is photolithographically etched into the microarray, and thus can be formed much quicker and with less damage to the cells than conventional dicing techniques. The etch is controlled to scale the individual solar cells to produce the desired output current, thus eliminating the prior need to connect the cells in parallel. Base contacts and integral emitter contact/ interconnects are formed using a photolithographic liftoff process to connect a number of the scaled solar cells in series to sum their voltages and thereby supply the desired output voltage and current. The photolithographic liftoff process is much quicker and less expensive than known soldering methods and provides substantially narrower line widths, reducing obscuration and weight.

For a better understanding of the invention, and to show how the same may be carried into effect, reference will now be made, by way of example, to the accompanying drawings.

DETAILED DESCRIPTION OF THE INVENTION

In the present invention, a monolithically integrated solar cell microarray is designed and fabricated in accordance with power supply specifications for a particular application. The solar cell microarray is fabricated on a single monolithic substrate by providing an isolation layer between the substrate and the solar cell base and emitter layers, and by etching those layers to expose the isolation layer. Taken together, the isolation layer and etch define the electrically isolated solar cells. The solar cells are thus defined simultaneously, which greatly reduces manufacturing time and cost. Furthermore, the etching process allows arbitrarily shaped and sized solar cells and does not damage the solar cells. The parallel interconnections required in the known microarrays to sum the cell currents are eliminated by directly scaling the solar cells' active areas to provide the desired supply current.

Because the solar cells are defined without sawing the wafer, the series interconnects can be formed using a photolithographic lift-off or etching process. This has several beneficial results. First, the interconnects can be formed in parallel at the same time as the emitter contacts. This adds no time to the fabrication of the microarray and saves ½ to 2 hours compared to the existing method. Second, the line width of the interconnects is reduced from 125 microns to approximately 5 microns. This reduces obscuration by 10–15% and reduces the weight of the metallization by a factor of approximately twenty-five. Third, integrating the interconnects with the emitter contacts improves the quality of the contact.

Figure 1:
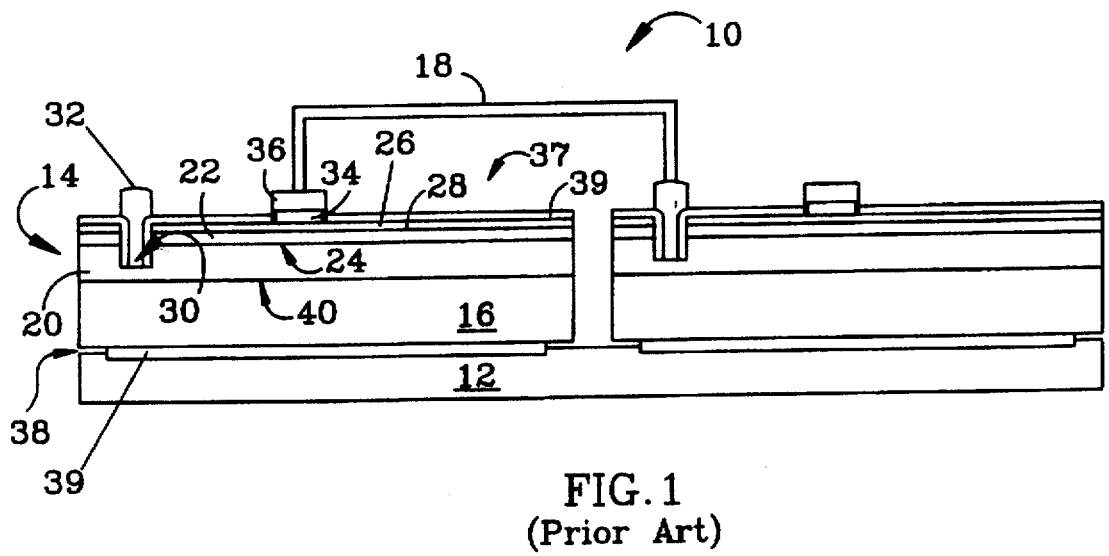
FIG. 1, described above, is a sectional view of a portion of a known microarray.
Figure 2:
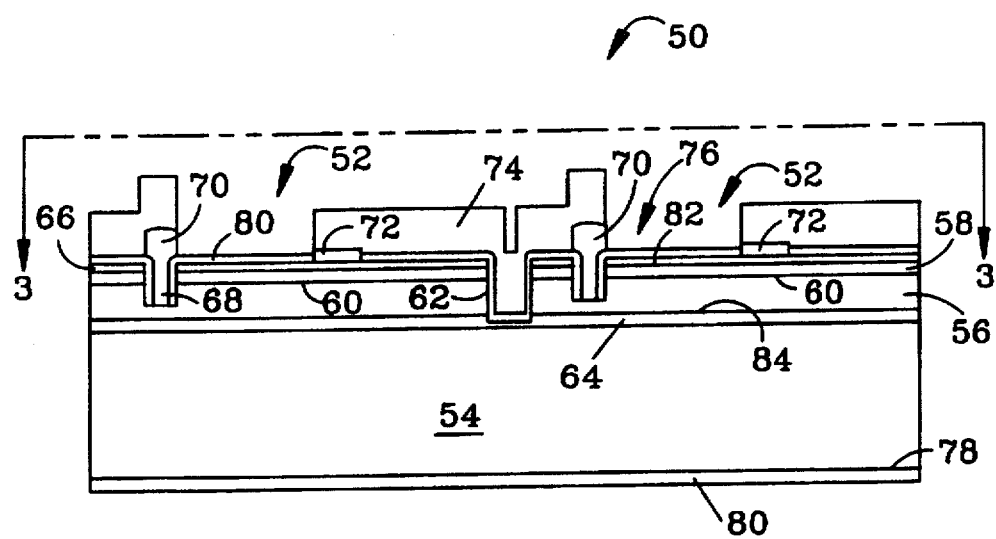
FIG. 2 is a sectional view of a portion of a monolithically integrated microarray along section line 2—2 in FIG. 3 in accordance with the present invention.

FIG. 2 is a sectional view of a portion of a monolithically integrated solar cell microarray 50 in accordance with the present invention. Microarray 50 includes a plurality of solar cells 52 formed on a monolithic substrate 54. The invention is described in conjunction with single junction GaAs solar cells 52 and a 200 microns thick n-type Ge substrate 54, but is applicable to multijunction solar cells and is not limited to the specific conductivities or materials shown. For example, the solar cells can be formed from InGaAsP, InGaAs, or InP. Furthermore, the invention allows larger GaAs microarrays to be fabricated on a large Si substrate.

The microarray 50 includes n and p-type GaAs base and emitter layers 56 and 58, respectively, that define a p/n junction 60 having a band gap of approximately 1.4 eV at their interface. The base and emitter layers are suitably 5 microns and 0.5 micron thick, respectively. A patterned trench 62 in the base and emitter layers and an isolation layer 64 between the base layer 56 and the substrate 54 together define the individual solar cells 52.

The patterned trench 62 exposes the isolation layer 64, thereby spacing the solar cells 52 apart by approximately 50 microns. The trench is preferably formed to expose the top surface of isolation layer 64. Alternately, the trench can be formed into or through the isolation layer 64 into the substrate 54. The trench 62 can be patterned so that the solar cells have the conventional rectangular shape, or other non-rectangular shapes such as triangles. Furthermore the trench can be patterned to scale the sizes of the solar cells by varying amounts to produce the desired supply currents. This eliminates the need to connect multiple cells in parallel, thereby reducing the weight of the microarray and the cost of production.

The isolation layer 64 electrically isolates the individual solar cells 52 from the substrate 54, thereby breaking the current leakage path between the cells through the substrate. This electrically isolates the solar cells 52 from each other. The isolation layer 64 is preferably a semiconductor material having the opposite conductivity type of the substrate 54 and base layer 56 and doped to have a high resistance. In the embodiment discussed, isolation layer 64 is suitably a 1 micron layer of p-type AlGaAs doped to have a band gap of approximately 2 eV. Alternately, other III-V materials could be used to form the isolation layer. Further, multiple isolation layers such as a p-n-p composite may also be used to reduce the electrical conductivity between the solar cells and the substrate.

The semiconductor material selected for the isolation layer 64 must also have thermal and lattice constant properties that are compatible with those of the substrate 54 and base layer 56. The material can be selected to have properties between those of GaAs solar cells and Ge substrates.

A p-type AlGaAs window layer 66, suitably 0.05 microns thick, passivates emitter layer 58. The window layer 66 is doped to have a band gap in excess of 2 eV so that incident light is transmitted through the window to the solar cells 52. A base contact region 68 is formed through the window and emitter layers into base layer 56. A base contact 70, suitably a AuGeNiAg alloy, is formed in contact region 68 to adhere to the n-type GaAs base layer 56. A p-type GaAs emitter contact pad 72 or "cap" layer is formed on top of window layer 66 in electrical communication with the emitter layer 58. An integrated emitter contact/interconnect 74, suitably a AuZnAg alloy, connects the p-type contact pad 72 of one cell 52 to the base contact 70 of another solar cell 52. The interconnect portion of contact/interconnect 74 has a line width of at most 25 microns and preferably approximately 5 microns, which reduces obscuration by 5–10% and reduces the overall metallization weight by a factor of approximately twenty-five.

The base and emitter/interconnect contacts are preferably formed from different metal alloys to improve their adherence to n and p-type GaAs base and emitter layers, respectively. Alternately, the interconnect could be formed integrally with the base contact instead of the emitter contact. Furthermore, the emitter and base contacts and interconnect can be formed as a single integral contact. Integration of the contacts improves their quality and simplifies the manufacturing process.

Light incident on the front or active surface 76 of the microarray passes through the window layer 66 and is partially absorbed in the emitter and base layers 56 and 58, respectively. The microarray's active surface 76, back or "shadowed" surface 78, and inner walls of the base contact region 68 and trench 62 are coated with an antireflection (AR) coating 80 such as tantalum pentoxide ($Ta_2O_5$) and aluminum oxide ($Al_2O_3$) that enhances light transmission, thereby increasing the array's power efficiency, and prevents shunting by the interconnecting top metals. The absorption of light causes a liberation of charge carriers, including electrons and holes, in the region of the p/n junction 60, which migrate towards the top surface 82 of the emitter layer and the bottom surface 84 of the base layer, depending upon their polarities. The opposite charge carriers are collected at the base contact 70 and emitter contact 74. This generates a potential of approximately 1 V across the solar cell 52 and supplies a current in the range of 1 to 5 milliamps, depending upon the size of the p/n junction's active area. The light penetrates only approximately 3 microns into the solar cell, and thus the p/n junction formed between the isolation layer 64 and substrate 54 is inactive.

Figure 3:
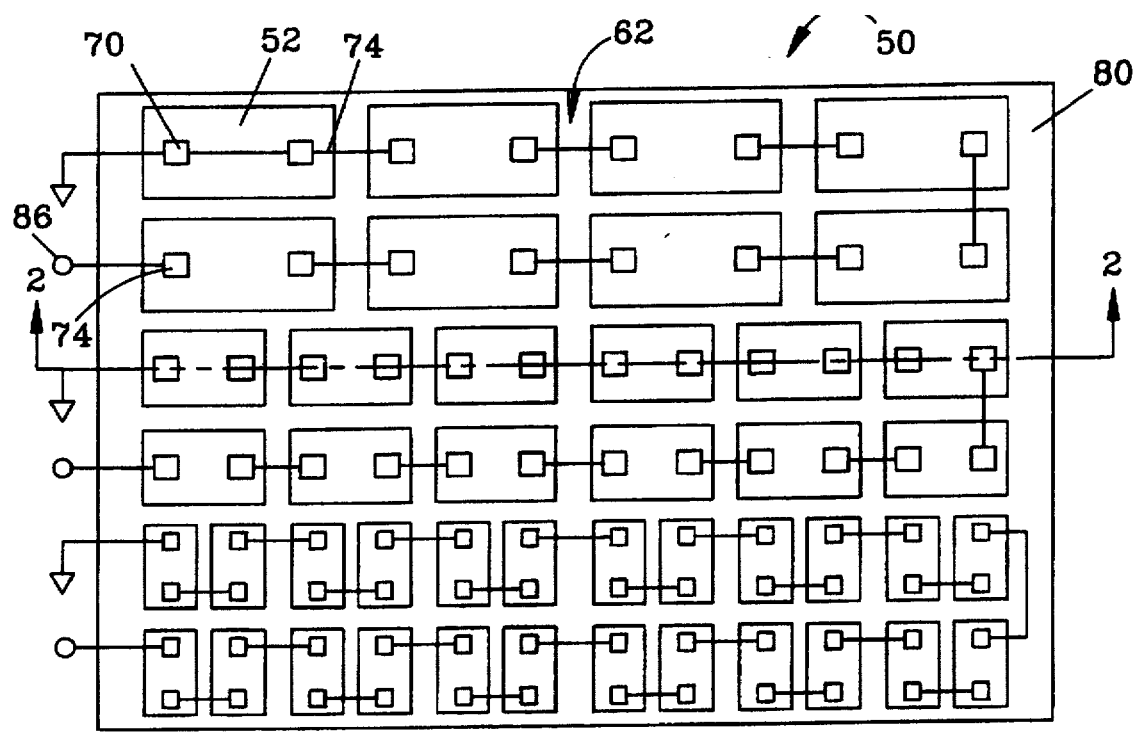
FIG. 3 is a plan view of the microarray in FIG. 2.

As shown in FIG. 3, the microarray 50 is designed and fabricated to provide one or more power supplies with desired voltage and current levels for a given application. The trench 62 is patterned to scale the solar cells relative to a reference cell, typically 1.2 cm by 0.3 cm, to provide the desired current levels. The emitter contact/interconnects 74 connect the solar cells into series strings to sum their voltages and produce the desired voltage levels.

In the particular example shown, microarray 50 provides three supplies: nominally an 8 V 3 milliamp supply, a 12 V 2 milliamp supply, and a 24 V 1 milliamp supply. The base contact of the first solar cell 52 in each string is connected to an external ground and the emitter contact 74 of the last solar cell 52 in each string is connected to an external voltage terminal 86. Alternately, the trench 62 could be patterned to provide unit sized solar cells which are then connected in parallel to provide the desired current levels. However, because the microarray is designed for a specific application, this would be inefficient.

Figure 4A:
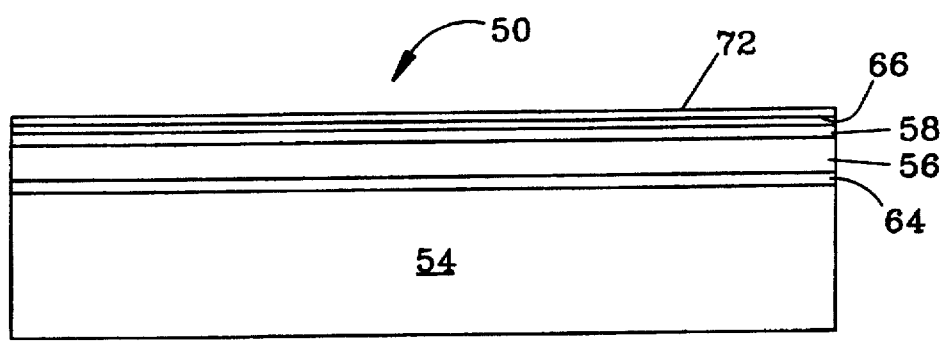
FIGS. 4a through 4f are sectional views illustrating sequential steps in the fabrication of the microarray in FIG. 2.

As shown in FIGS. 4a through 4f, the monolithically integrated solar cell microarray 50 of FIGS. 2 and 3 is fabricated entirely with a photolithographic process which does not require sawing the wafer to isolate the individual cells or manually soldering the electrically conductive interconnects. Furthermore, the solar cells and interconnects are fabricated to provide a power supply(s) for a specific application. In FIG. 4a, the Ge wafer 54 has been grown and the isolation, base, emitter, window, and cap layers 64, 56, 58, 66, and 72, respectively, have been epitaxially formed thereon with thickness of 200 microns, 1 micron, 5 microns, 0.5 micron, 0.05 micron and 0.5 micron, respectively.

Figure 4B:
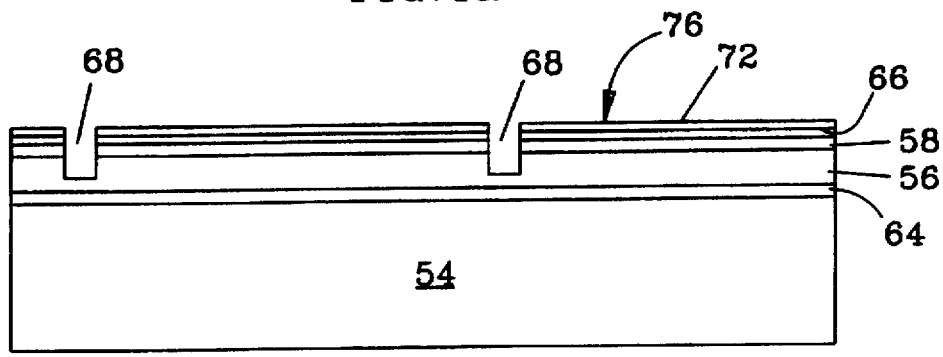
Figure 4C:
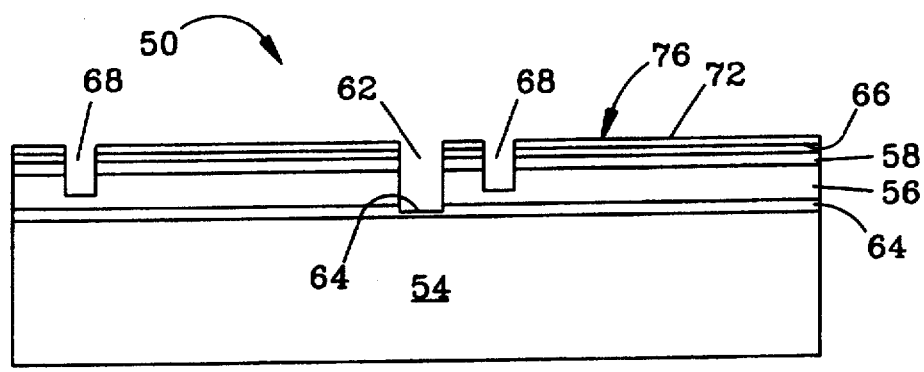
Figure 4D:
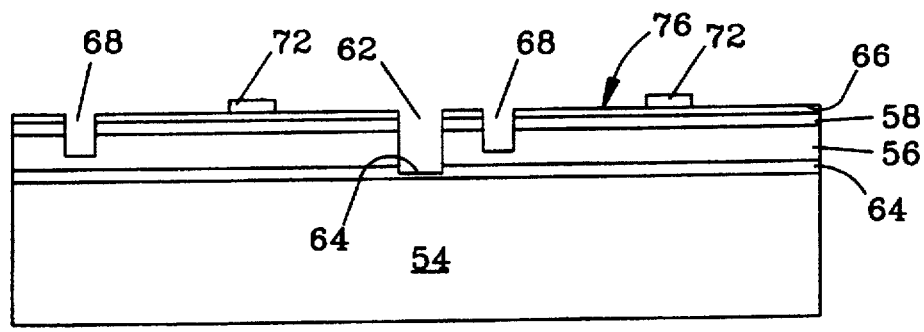

In FIG. 4b, base contact regions 68 have been formed through the cap, window, and emitter layers and into the base layer 56. This is preferably done by masking the active surface 76 of the microarray 50 and then chemically etching the exposed portions to a depth of approximately 3 to 4 microns. In FIG. 4c, trench 62 has been patterned through the cap, window, emitter, and base layers to expose the isolation layer 64. This is preferably done by masking the active surface 76 of the microarray 50 and then chemically etching the exposed portions to a depth of approximately 6.5 microns. In FIG. 4d, the cap layer has been etched with a similar process to defined the emitter contact pad 72. The ordering of the fabrication steps shown in FIGS. 4b through 4d can be interchanged.

Figure 4E:
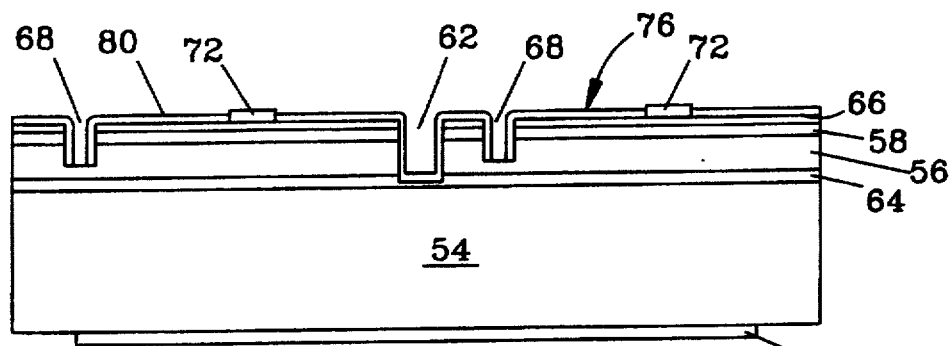
Figure 4F:
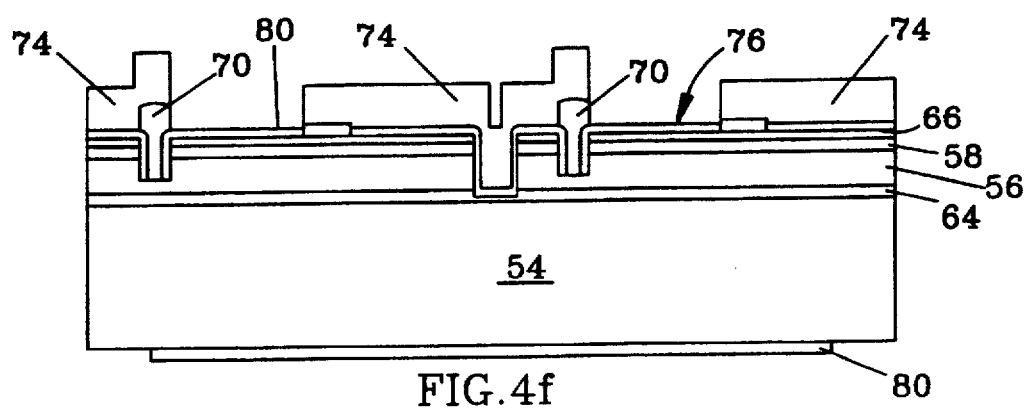

In FIG. 4e the AR coating 80 has been formed over both the microarray's shadowed and active surfaces. The active surface is masked so that the AR coating does not cover the bottom of base contact regions 68 and emitter contact pad 72. In FIG. 4f the base contacts 70 and emitter contact/ interconnect 74 have been deposited on the active surface 76 to configure the solar cells to provide the desired power supplies. The base contacts and emitter contact/ interconnects are fabricated in respective photolithographic liftoff steps to accommodate the different metal alloys. Each liftoff step includes forming a photoresist layer over the microarray, etching the photoresist to expose the base contact region or emitter contact pad, forming the appropriate metallization layer over the patterned photoresist so that it adheres to the base layer or the emitter contact pad, and lifting off the photoresist to remove the remaining metallization. Alternately, the metal contacts can be formed by etching.

The photolithographic process used to fabricate the microarray has several advantages over the known fabrication techniques. The trench etch is accomplished in a single parallel step which can be much quicker and cheaper than conventional dicing. The parallel trench etch does not damage the solar cells and reduces the spacing between cells, which improves the microarray's overall efficiency. Furthermore, the solar cells are not limited to rectangular shapes. The photolithographic liftoff process forms the interconnects at the same time and integral with the emitter contacts. This reduces fabrication time and cost and improves the quality of the contacts. The photolithographically defined interconnects have a much narrow line width than prior solder interconnects, and thus reduce light obscuration and weight.

Figure 5:
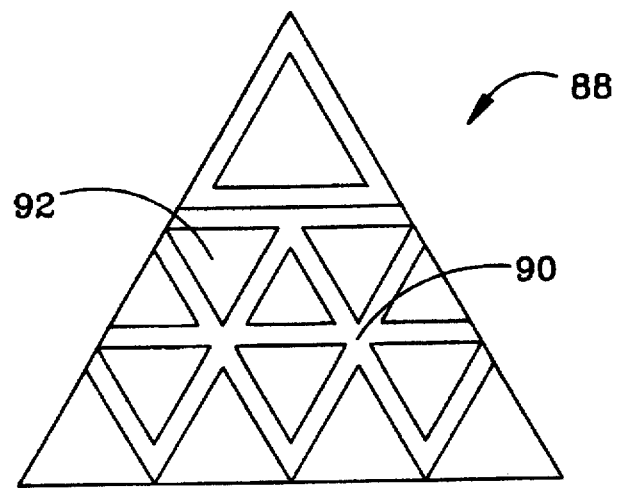
FIG. 5 is a plan view of an alternate embodiment of the microarray illustrating non-rectangular solar cells.

FIG. 5 shows an alternate embodiment of a microarray 88, in which the spacecraft requires a triangularly shaped microarray. In this embodiment, the trench mask is designed to provide a triangularly patterned trench 90 that defines triangularly shaped solar cells 92.

Figure 6:
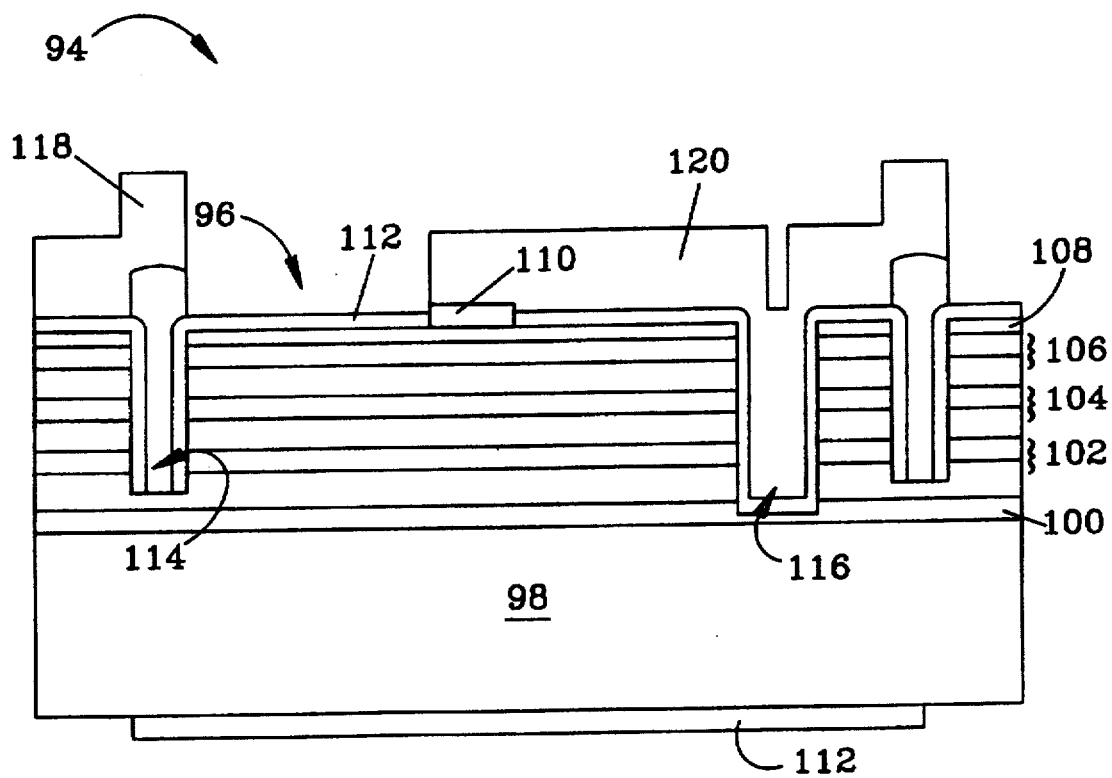
FIG. 6 is a sectional view of a multijunction monolithically integrated microarray formed in accordance with the invention.

FIG. 6 is a sectional view of a microarray 94 that includes multijunction solar cells 96 formed on a monolithic substrate 98. An isolation layer 100, suitably p-type AlGaAs, separates the solar cells 96 from the substrate 98. Alternately, the isolation layer could be a composite p-n-p type layer. The multijunction solar cell 96 includes three pair of base-emitter layers 102, 104, and 106 formed from Ge, GaAs, and GaInP$_2$ with band gaps of approximately 0.6, 1.4, and 1.9 eV, respectively. A window layer 108, emitter contact pad 110 and AR coating 112 are formed similarly to the single junction solar cells. A base contact region 114 is etched through to the base layer in the bottom most pair 102 and the trench etch 116 is etched through the three layer pairs to expose the isolation layer 100. Base contacts 118 and emitter contact/interconnects 120 are formed in and on the base contact region 114 and emitter contact pad 110, respectively. Light incident on the microarray penetrates to all three p/n junctions, thereby producing a potential of approximately 2.5 V.

While several illustrative embodiments of the invention have been shown and described, numerous variations and alternate embodiment will occur to those skilled in the art. Such variations and alternate embodiments are contemplated, and can be made without departing from the spirit and scope of the invention as defined in the appended claims.

We claim:

1. A monolithically integrated solar cell microarray, comprising:

a monolithic single-crystal semiconductor substrate;

an isolation layer on said substrate, said isolation layer having lattice properties that are compatible with those of the single-crystal semiconductor substrate; and a plurality of semiconductor solar cells comprising III-V materials on said isolation layer and spaced apart from each other, said isolation layer having a band gap that electrically isolates the solar cells from the semiconductor substrate and from each other.

2. The microarray of claim 1, wherein said solar cells are gallium-arsenide (GaAs) and the substrate is germanium (Ge).

3. The microarray of claim 2, wherein said germanium substrate has a band gap of approximately 0.6 ev, said isolation layer comprising a III-V material whose band gap isolates the solar cells from the substrate.

4. The microarray of claim 1, wherein said solar cells have a non-rectangular shape.

5. The microarray of claim 1 wherein said solar cells have respective active areas, said solar cells generating cell voltages and supplying cell currents in proportion to the sizes of their respective active areas in response to incident light, a set of said solar cells being connected in series to sum their voltages to provide an array voltage at an output and having their active areas scaled to supply scaled cell currents at a selected array current level at said output.

6. The microarray of claim 5, wherein said solar cells have active surfaces facing away from said substrate, each solar cell in said set comprising:

a semiconductor base layer on said isolation layer and scaled with respect to said reference area;

a semiconductor emitter layer on said base layer and scaled with respect to said reference area, an interface between said base and emitter layers forming a p/n junction with the scaled active area;

a base contact on the active surface, said base contact extending through said emitter layer to said base layer; and an integral emitter contact/interconnect on the active surface in electrical communication with said emitter layer and with said base contact on another one of said solar cells in said set, said p/n junction establishing the cell voltage and scaled cell current between said base and emitter contacts in response to incident light on the cell's active surface.

7. The microarray of claim 6, wherein said isolation layer has the opposite conductivity of said substrate and said base layer.

8. The microarray of claim 6, wherein said emitter contact/interconnect has a line width of at most 25 microns.

9. The microarray of claim 1, wherein said solar cells have respective active surfaces facing away from said substrate, each solar cell in a set comprising:

a semiconductor base layer on said isolation layer;

a semiconductor emitter layer on said base layer, an interface between said base and emitter layers forming a p/n junction;

a base contact on the active surface, said base contact extending through said emitter layer to said base layer;

an emitter contact on the active surface and in electrical communication with said emitter layer, said p/n junction establishing a cell voltage and a cell current between said base and emitter contacts in response to incident light on the cell's active surface; and an interconnect on said active surface formed integrally with one of said base and emitter contacts and in contact with one of said base and emitter contacts on another one of said solar cells in said set, the interconnects configuring the solar cells to sum their cell voltages and currents to supply a set voltage and a set current at an output.

10. The microarray of claim 9, wherein said solar cells' p/n junctions have respective active areas that are scaled so that their respective cell currents supply the set current, said interconnects being configured to connect the solar cells exclusively in series to sum their voltage to produce the set voltage.

11. The microarray of claim 9, wherein said isolation layer has a conductivity opposite to said substrate and said base layer.

12. The microarray of claim 9, wherein said interconnect has a line width of at most 25 microns.

13. The microarray of claim 1, wherein said substrate is single-crystal silicon (Si) and said solar cells are gallium-arsenide (GaAs).

14. The microarray of claim 13, wherein said isolation layer comprises a III-V material whose band gap exceeds that of silicon.

15. The microarray of claim 14, wherein said III-V material comprises a GaAs compound.

16. The microarray of claim 1, wherein said solar cells are multi-function solar cells having active surfaces facing away from said substrate, each multi-junction solar cell comprising a plurality of base-emitter layer pairs;

a base contact on the active surface that extends through the plurality of base-emitter pairs to the base layer on said isolation layer; and an integral emitter contact/interconnect on the active surface in electrical communication with the topmost emitter layer and with said base contact on another one of said multi-junction solar cells in said set, said base-emitter layer pairs having successively larger band gap energies so that light incident on the microarray's active surface penetrates all of said base-emitter layer pairs to produce a potential between said base and integral emitter contacts that is approximately the sum of the potentials produced by the different base-emitter layer pairs.

17. The microarray of claim 16, wherein said substrate is single-crystal germanium.

18. A monolithically integrated solar cell microarray that supplies an output voltage and an output current at a terminal in response to irradiation of light on its active surface, comprising:

a monolithic single-crystal germanium substrate having a band gap of approximately 0.6 electron volts (ev);

an isolation layer on said substrate;

a gallium-arsenide (GaAs) base layer on said isolation layer;

a gallium-arsenide (GaAs) emitter layer formed on top of said base layer;

a trench in said base and emitter layers that exposes said isolation layer and defines a plurality of solar cells that each produce a cell voltage and which are scaled to provide the array current, said isolation layer having lattice properties that are compatible with those of the single-crystal germanium substrate and the GaAs base layer and having a band gap greater than 0.6 ev that isolates the solar cells from the germanium substrate and from each other;

a plurality of base contacts on the active surface, said base contacts extending through said emitter layer to said base layer in the respective solar cells; and a plurality of integral emitter contact/interconnects on the active surface in electrical communication with said emitter layer in the respective solar cells and with said base contacts on successive ones of said solar cells so that said solar cells are connected in series to sum their cell voltages to produce the array voltage and array current at the terminal.

19. The microarray of claim 18, wherein said isolation layer comprises a gallium-arsenide (GaAs) compound whose band gap exceeds 1.6 ev.

20. The microarray of claim 18, wherein said solar cells have a non-rectangular shape.

21. The microarray of claim 18, wherein said isolation layer has a conductivity opposite to said substrate and said base layer.

22. The microarray of claim 18, wherein said emitter contact/interconnect has a line width of at most 25 microns.

23. A method of fabricating a monolithically integrated solar cell microarray, comprising:

providing a monolithic single-crystal semiconductor substrate;

epitaxially forming an isolation layer on said substrate, said isolation layer having lattice properties that are compatible with those of the single-crystal semiconductor substrate, epitaxially forming a semiconductor base layer on said isolation layer;

epitaxially forming a semiconductor emitter layer on said base layer, said base and emitter layers comprising III-V materials and an interface between them forming a p/n junction; and patterning said base and emitter layers to expose said isolation layer and thereby define an array of discrete solar cells on said monolithic single-crystal substrate that produce respective cell voltages and cell currents in response to irradiation of light on said microarray, said isolation layer having a band gap that electrically isolates the solar cells from the semiconductor substrate and from each other.

24. The method of claim 23, wherein patterning said base and emitter layers comprises:

forming a photoresist mask on said emitter layer to expose a trench pattern;

etching the exposed trench pattern into the emitter layer and the underlying portion of the base layer to expose the isolation layer; and removing the photoresist mask.

25. The method of claim 24, wherein said photoresist mask defines non-rectangular shaped solar cells.

26. The method of claim 23, wherein the solar cells' p/n junctions have respective active areas, said solar cells' base and emitter layers being patterned to scale the p/n junction active areas so that their cell currents supply a selected array current.

27. The method of claim 26, further comprising:

patterning said emitter and base layers to form a base contact region for each of said solar cells;

forming an emitter contact pad on said emitter layer for each of said solar cells; and forming a metallization pattern that is affixed to the base contact regions and emitter contact pads to connect a selected number of said solar cells in series to sum their cell voltages to produce an array voltage along with said array current at an output terminal.

28. The method of claim 27, wherein forming the metallization pattern comprises:

forming a base contact in each of said base contact regions; and forming an integral emitter contact/interconnect on each of said emitter contact pads to one of said base contacts on another one of the selected solar cells.

29. The method of claim 28, wherein said base contact and said emitter contact/interconnect are formed using photolithographic liftoff processes.

30. The method of claim 23, further comprising:

patterning said emitter and base layers to form a base contact region for each of said solar cells;

forming an emitter contact pad on said emitter layer for each of said solar cells;

forming a base contact in each of said base contact regions;

forming an emitter contact on each of said emitter contact pads; and forming an interconnect integrally with one of said base and emitter contacts and in contact with one of said base and emitter contacts on another one of the selected solar cells to configure said solar cells to sum their cell voltages and currents to produce an array voltage and a selected array current at an output terminal.

31. The method of claim 30, wherein the solar cells' p/n junctions have respective active areas, said solar cells' base and emitter layers being patterned to scale their active areas with respect to a reference area so that their cell currents supply the selected array current.

32. The method of claim 31, wherein said interconnects are formed integrally with respective ones of said emitter contacts in a single parallel photolithographic liftoff step to contact the base contacts on another one of said solar cells to connect them in series to produce the array voltage at said terminal.

33. The method of claim 23, wherein said substrate is single-crystal germanium.

34. The method of claim 33, wherein said germanium substrate has a band gap of approximately 0.6 ev, said isolation layer comprising a III-V material whose band gap isolates the solar cells from the substrate.

35. The method of claim 23, wherein said substrate is single-crystal silicon (Si) and said solar cells are gallium-arsenide (GaAs).

36. The method of claim 35, wherein said isolation layer comprises a III-V material whose band gap exceeds that of silicon.

37. The method of claim 23, wherein said solar cells are multi-junction solar cells that comprise a plurality of base-emitter layer pairs that are formed on the substrate with the bottommost base layer being formed on the isolation layer and the topmost layer having an active surface that faces away from said substrate, further comprising forming a base contact on the active surface that extends through the plurality of base-emitter layer pairs to the base layer on said isolation layer; and forming an integral emitter contact/interconnect on the active surface in electrical communication with the topmost emitter layer and with said base contact on another one of said multi-junction solar cells in said set, said base-emitter layer pairs having successively larger band gap energies so that light incident on the microarray's active surface penetrates all of said base-emitter layer pairs to produce a potential between said base and integral emitter contacts that is approximately the sum of the potentials produced by the different base-emitter layer pairs.

38. A method of fabricating a monolithically integrated solar cell microarray, comprising:

providing a monolithic single-crystal germanium substrate having a band gap of approximately 0.6 electron volts (ev);

epitaxially forming an isolation layer comprising a III-V material on said substrate;

epitaxially forming a base layer comprising a III-V material on said isolation layer;

epitaxially forming an emitter layer comprising a III-V material on said base layer, an interface between said base and emitter layers forming a p/n junction; and patterning said base and emitter layers to expose said isolation layer and thereby define an array of discrete solar cells on said monolithic single-crystal germanium substrate that produce respective cell voltages and cell currents in response to irradiation of light on said microarray, said isolation layer having lattice properties that are compatible with those of the single-crystal germanium substrate and the base layer and having a band gap greater than 0.6 ev that isolates the solar cells from the germanium substrate and from each other.

39. The method of claim 38, wherein the III-V material in said base and emitter layers comprise gallium-arsenide.

* * * * *